(12) United States Patent
Barrenscheen et al.

(10) Patent No.: US 6,297,761 B1
(45) Date of Patent: Oct. 2, 2001

(54) MEASURING APPARATUS FOR DIGITALLY DETECTING ANALOG MEASURED VARIABLES

(75) Inventors: Jens Barrenscheen, München; Andreas Jansen, Murnau; Hermann Kern, Mammendorf; Heinz Amann, Garching, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/267,291

(22) Filed: Mar. 12, 1999

(30) Foreign Application Priority Data

Mar. 12, 1998 (DE) .............................. 198 10 826

(51) Int. Cl.⁷ .................................................. H03M 1/50
(52) U.S. Cl. ................................ 341/166; 375/1; 341/118
(58) Field of Search ................................ 341/166, 119, 341/118, 164, 161, 156, 145, 136, 120, 114, 115; 375/1; 250/368; 364/557

(56) References Cited

U.S. PATENT DOCUMENTS

| | | | |
|---|---|---|---|
| 4,387,465 | * 6/1983 | Becker | 375/1 |
| 5,056,048 | * 10/1991 | Seperant | 364/557 |
| 5,400,025 | * 3/1995 | Pfeiffer | 341/119 |
| 5,905,262 | * 5/1999 | Spanswick | 250/368 |

FOREIGN PATENT DOCUMENTS

| | | |
|---|---|---|
| 2614947 | 10/1977 | (DE) . |
| 2725618 | 11/1979 | (DE) . |
| 3921951A1 | 12/1990 | (DE) . |
| 3943394A1 | 7/1991 | (DE) . |
| 4115760A1 | 11/1992 | (DE) . |
| 4210848A1 | 8/1993 | (DE) . |
| 4330486A1 | 3/1995 | (DE) . |
| 4342868A1 | 6/1995 | (DE) . |
| 19704132A1 | 8/1997 | (DE) . |

* cited by examiner

Primary Examiner—Brian Young
Assistant Examiner—John Nguyen
(74) Attorney, Agent, or Firm—Herbert L. Lerner; Laurence A. Greenberg; Werner H. Stemer

(57) ABSTRACT

A measuring apparatus has a sensor element that produces an output signal proportional to a variable to be measured. An integrator which, beginning at a starting value, integrates the output signal from the sensor element. A comparator is connected downstream of the integrator, compares the output signal from the integrator with a threshold value, and outputs an output signal corresponding to the result of the comparison. A reset device that is likewise connected downstream of the comparator and resets the integrator to the starting value at specific times. This is a simple way of achieving integrability in autonomous modules.

11 Claims, 2 Drawing Sheets

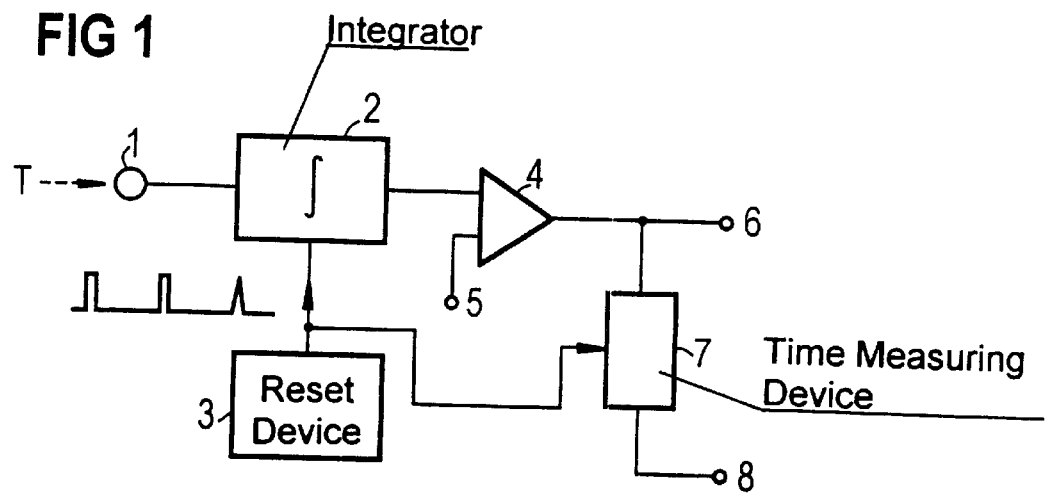
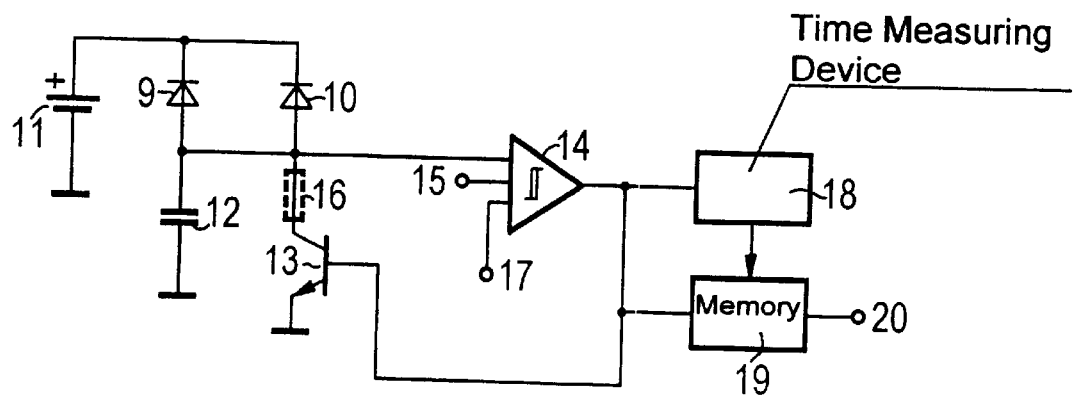

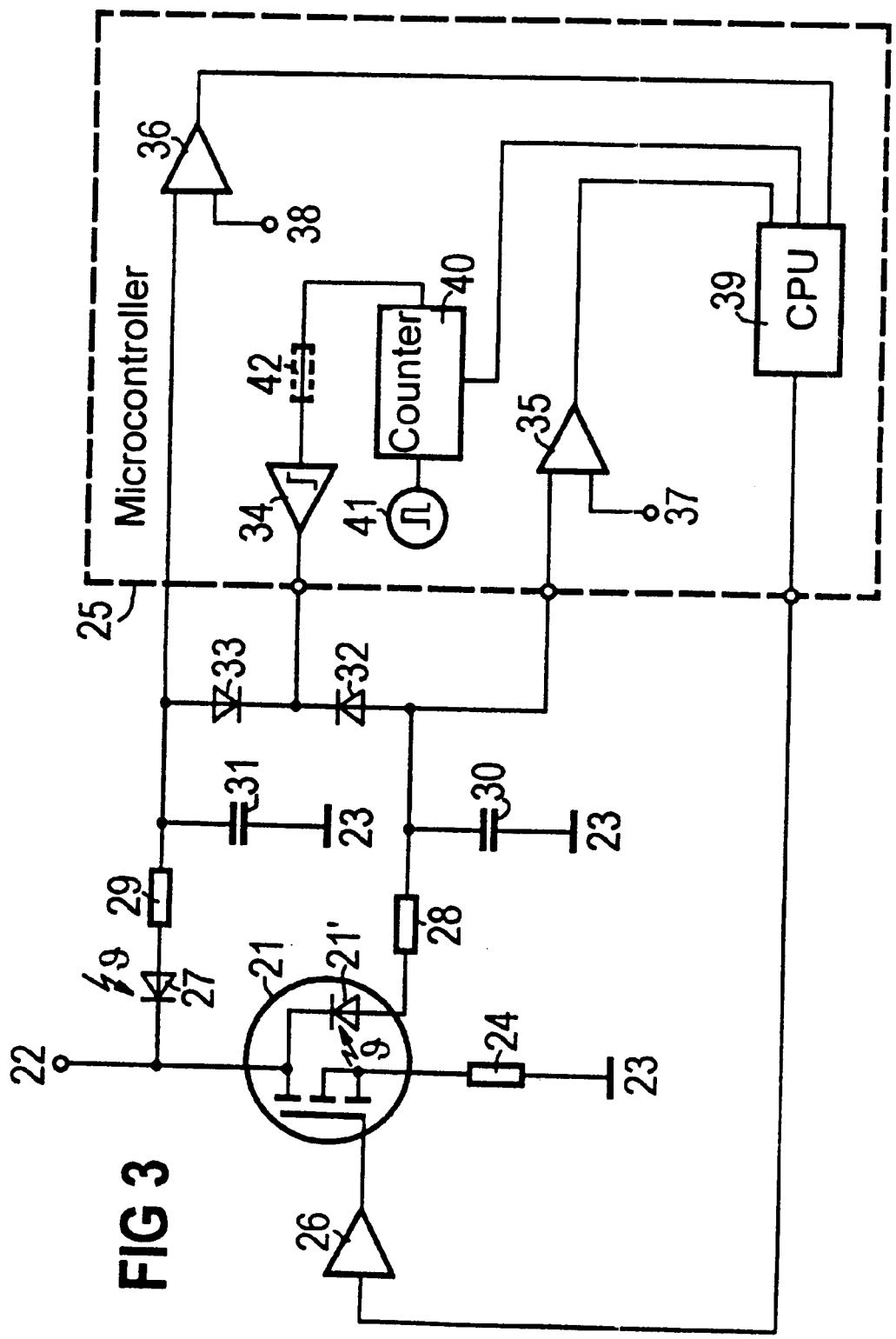

MEASURING APPARATUS FOR DIGITALLY DETECTING ANALOG MEASURED VARIABLES

BACKGROUND OF THE INVENTION

FIELD OF THE INVENTION

The invention relates to a measuring apparatus for digitally detecting analog measured variables.

Most currently known sensor elements supply the result of a measurement in the form of an analog variable. By contrast, further processing of the signals is nowadays preferably digital, so that an analog/digital conversion facility needs to be provided within the signal chain. Hence, particularly when microcomputers or microcontrollers are used for further digital signal processing, analog/digital converters are usually connected between the sensor element and the microcomputer/microcontroller. When this is done, the additionally required circuit complexity rises in proportion to the accuracy demanded for the conversion. This complexity is regarded as being too high for numerous applications.

SUMMARY OF THE INVENTION

It is accordingly an object of the invention to provide a measuring apparatus for digitally detecting analog measured variables that overcomes the above-mentioned disadvantages of the prior art devices of this general type, which has a lower level of complexity for the same accuracy.

With the foregoing and other objects in view there is provided, in accordance with the invention, a measuring apparatus, including: a sensor element producing a sensor output signal proportional to a variable to be measured; an integrator connected to the sensor element that, beginning at a starting value, integrates the sensor output signal from the sensor element and outputs an integrator output signal; a comparator connected downstream of the integrator, the comparator comparing the integrator output signal with a threshold value and outputs a compartor output signal corresponding to a result of the comparison; and a reset device connected downstream of the comparator and resetting the integrator to the starting value at specific times.

The measuring apparatus according to the invention contains a sensor element, an integrator, a comparator and a reset device. In the apparatus, the sensor element produces a current that is proportional to a variable to be measured. The current is integrated by the integrator, beginning at the starting value. The comparator connected downstream of the integrator compares the output signal from the integrator with a threshold value and outputs an output signal corresponding to the result of the comparison. The reset device connected downstream of the comparator resets the integrator to the starting value at specified times. In this case, the starting value can be any desired value between zero and the threshold value, including zero itself. If the threshold value is exceeded inside a fixed time window between two reset instants, this indicates that a specified measured value has been exceeded.

In a development of the invention, a time measuring device downstream of the comparator measures the time duration between the starting value being exceeded and the threshold value being reached and outputs a signal corresponding to the time duration as a measure of the measured value obtained at the sensor element. Therefore, the exact measured value can now be determined.

The instant at which the integrator is reset to the starting value can either occur at fixed regular time intervals, or else whenever the threshold value has been exceeded. Which of these two possibilities is used in any given case depends on the respective application.

The integrator is preferably formed by an individual capacitor, the voltage present across the capacitor corresponding to the integral of the output current from the sensor element. It is therefore advantageous to use only a single capacitor, because the passive configuration produces no additional interference noise or offsets and, furthermore, the circuit complexity is extremely low.

In this configuration, a resistor may be connected upstream of the capacitor, i.e. the current from the sensor element is passed to the capacitor via the resistor. In this case, the resistor is used for current limiting and thus for protecting the sensor element and the capacitor in the event of faults occurring, for example.

The capacitor is preferably discharged through a reset device having a controlled switch which is switched on by the comparator if the threshold value at the output of the comparator is exceeded and thus connects the capacitor to a reference voltage source governing the starting value. In this case, the reference voltage is connected to the capacitor and thus defines the starting value.

The time measuring device preferably has a counter that is connected downstream of a reference clock source and is controlled by the comparator. In this way, a time measuring device having a high level of accuracy can be produced with a low level of circuit complexity.

The sensor element provided is, in particular, a reverse-biased pn semiconductor junction whose reverse current is exponentially dependent on the temperature at the semiconductor junction. As a current is output directly, no additional circuitry is necessary. The pn semiconductor junction may be a diode or a transistor wired up accordingly, for example. Furthermore, instead of a semiconductor junction for measuring temperature, it is also possible to use a photosensitive semiconductor junction for measuring light in the same way. Other sensors which output a current or use special converter circuits connected downstream to output a current proportional to the measured variable are also suitable in the same way.

The comparator and/or the time measuring device and/or the reset device are preferably configured such that they are also integrated in a microcomputer or microcontroller or that devices already present in them are used appropriately. Under certain circumstances, this enables the additionally required external complexity to be reduced to the sensor element itself and a capacitor.

The measuring apparatus according to the invention is particularly suitable for measuring the silicon temperature of semiconductors and, in particular, of power semiconductors. In this case, a diode is also integrated into the transistor or into the chip and thus detects the temperature of the silicon exactly. If reverse-biased, the reverse current in the diode changes exponentially with temperature. This exponential characteristic allows broad temperature ranges to be determined, even with manufacturing tolerances.

According to the invention, the silicon temperature is detected using temperature/time conversion. The reverse current supplied by the integrated diode (or other pn junction) feeds a temperature-dependent current to a capacitor. The integrating behavior of the capacitor results in achieving effective interference suppression at the same time. The reverse current supplied determines the rise in the voltage across the capacitor, so that sooner or later the threshold value is reached.

In this configuration, the voltage across the capacitor is monitored by the comparator. The interrupt input of a microcomputer/microcontroller may also be used as a comparator in the same way. Furthermore, the capture capability of the microcomputer/microcontroller allows measurement of the time elapsing between the capacitance being discharged and the threshold value being reached. In this case, the capacitor can in each case be discharged after the threshold value has been reached, or else cyclically. With cyclic discharging, it is also possible to produce a simple overheating protection facility in that an interrupt is output as soon as the threshold value is reached. In this case, the discharging period must be the same as the time corresponding to the desired turn-off temperature. In this mode of operation (overtemperature protection), cyclic discharging takes place, after appropriate initialization of the timer, without burdening the central processor unit at all. The microcomputer/microcontroller is burdened slightly only by the interrupt responding to the threshold value being reached. The microcomputer/microcontroller can then turn off the corresponding power semiconductor, for example, or take other measures. For measuring temperature, the sensor element used is a reverse-biased pn semiconductor junction, for example a diode or a transistor, which is integrated into the power semiconductor.

The measuring apparatus according to the invention is distinguished by the following advantages: spurious pulses are filtered out by integration. With the appropriate use of the microcontroller/microcomputer, no active external components are required. [lacuna] measured variables, particularly temperature monitoring, is possible in real time and without burdening the central processor unit (CPU), because monitoring is performed only by hardware and not by software on the microcontroller/microcomputer.

In connection with a diode that is also integrated in a power semiconductor, a switching unit can be produced which is controlled by the microcontroller/microcomputer and at the same time is monitored, without any great additional complexity, with regard to the chip temperature of the power semiconductor and possibly also with regard to ambient temperature. This makes it possible to recognize critical states in good time and to turn off the power semiconductor largely independently. In this case, both individual as well as group monitoring are possible. The threshold values (e.g. limit temperatures) can be set using hardware or software.

Other features which are considered as characteristic for the invention are set forth in the appended claims.

Although the invention is illustrated and described herein as embodied in a measuring apparatus for digitally detecting analog measured variables, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic block circuit diagram of a first general exemplary embodiment of a measuring apparatus according to the invention;

FIG. 2 is a block circuit diagram of a second exemplary embodiment of the measuring apparatus; and FIG. 3 is a circuit diagram of a third exemplary embodiment of the measuring apparatus.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a measured variable T detected by a sensor 1. Examples of a possible measured variable T are temperature, light intensity, pressure, etc. The sensor 1 then converts the variable T to be measured into a proportional analog signal that is integrated by an integrator 2, beginning at a starting value. The starting value is provided, for example, by a reset device 3 that resets the integrator 2 to the starting value at specific instants, for example at regular intervals. The integrator 2 has a comparator 4 connected downstream of it which compares the output signal from the integrator 2 with a threshold value 5 and outputs an output signal on the basis of this. Thus, for example, the output of the comparator 4 produces a logic level H whenever the output signal from the integrator 2 is above the threshold value, and a logic level L whenever the output signal from the integrator 2 is the same as the threshold value 5 or is below it. If only one limit value, for example temperature, is to be monitored, then the output signal from the comparator 4 can be used as the output variable 6 by selecting the threshold value 5 to be the same as the limit value to be monitored for the measured variable T.

In this case, after the integrator 2 has been reset, the output signal from the sensor 1 is integrated, so that the signal at the output of the integrator 2 rises steadily. The rise in the output signal lasts until the reset device 3 produces another reset. In this instant, if the output signal from the integrator 2 exceeds the threshold value 5 between two reset instants, then a corresponding signal 6 will be produced. Otherwise, the state at the output of the comparator 4 remains unchanged. The signal change at the output of the comparator 4 can now be evaluated as meaning that a specific limit value is being exceeded. In this case, the signal 6 can be fed to the interrupt input of a microcontroller, for example. As soon as the threshold value is reached, an interrupt is triggered in the microcontroller and causes the microcontroller to initiate appropriate measures. In this case, the discharge signal period must be the same as the time corresponding to the desired limit value. This may be a specific temperature, for example, above which certain apparatuses are to be turned on or off.

For many applications, however, it is necessary to detect the exact measured value instead of purely monitoring a limit value. With the present circuit, this can be achieved without any great additional complexity. To this end, all that is required is a time measuring device 7 which determines the time between the appearance of the reset signal and the appearance of the signal 6 indicating that the threshold value has been exceeded, and outputs this time as a digital signal 8 proportional to the measured value T.

Accordingly, the measured variable is initially detected by a measured variable/time conversion in which the signal supplied by the sensor 1 is integrated by the integrator 2, and the integrator 2 is discharged cyclically. The output signal from the sensor 1 determines the gradient of the signal at the output of the integrator 2, so that the threshold value 5 is reached sooner or later. In this instant, the reset signal period should be the same as the time corresponding to the lowest variable to be measured. A long time duration between resetting and reaching the threshold value corresponds to a small measured value in this case.

In a second exemplary embodiment shown in FIG. 2, the temperature is measured at two different points by two reverse-biased diodes 9 and 10. Since group monitoring of the temperatures at the two different places is intended to take place, the two diodes 9, 10 are connected in parallel with one another, and the series circuit made up of the two diodes 9, 10 forms a circuit together with a series-connected capacitor 12 and a voltage source 11. In this configuration, the capacitor 12 is supplied with the sum of the reverse currents in the individual diodes 9 and 10. The summed current is integrated by the capacitor 12. The voltage across the capacitor is in this case the same as the integral, weighted using a constant factor, of the sum of the two currents, with the currents always responding exponentially to the respective temperature. However, on account of the exponential relationship, the diode at the higher temperature makes a much more significant contribution to the total current and thus essentially determines the instant at which the threshold value is exceeded (group monitoring). To reset the integrator and hence the capacitor 12, a transistor 13 is provided whose load path is connected in parallel with the capacitor 12.

When the transistor 13 is turned on, the capacitor 12 is short-circuited and discharging takes place via the load path of the transistor 13. In this case, the transistor 13 can be an open collector output of a microcontroller/microcomputer.

The voltage across the capacitor 12 is monitored with respect to a threshold value 15 by a Schmitt trigger 14. After the threshold value 15 has been exceeded, there is a level change at the output of the Schmitt trigger 14 from, for example, logic level L to logic level H. However, this causes the transistor 13, whose base is connected to the output of the Schmitt trigger 14, to be turned on and the capacitor 12 to be short-circuited. Discharging takes place down to a voltage, across the capacitor, which characterizes the starting value and is in this case distinguished by a lower threshold value 17 of the Schmitt trigger 14.

Alternatively, the starting value for the capacitor 12 could be approximately zero. If the lower threshold value 17 is infringed, the signal at the output of the Schmitt trigger 14 changes from logic level H to logic level L, as a result of which the transistor 13 changes from the on to the off state. The change in the output signal initially from logic level L to logic level H after the upper threshold value 15 has been exceeded, and the subsequent change from logic level H to logic level L after the lower threshold value 17 (starting value) has been infringed, define a pulse whose width is dependent on the discharge time of the capacitor 12. Hence, in order to modify the pulse width, a resistor 16 can be connected in series with the load path of the transistor 13 if required. The resistor can also be provided for limiting the current through the transistor 13.

The pulse produced in this way is firstly used to transfer the value of a time measuring device 18 to a memory 19 and secondly to reset the time measuring device 18. In this case, the data are transferred to the memory 19 on a rising edge, for example, at the output of the Schmitt trigger 14, and the time measuring device 18 is reset on a negative edge. The result of the measurement can be picked up at the output of the memory 19 as a digital word 20. If, for example, only one threshold value is used, then the base of the transistor 13 should have a timer connected upstream of it, to govern the discharge time.

In the measuring apparatus shown in FIG. 2, the two reverse-biased diodes 9 and 10 for measuring temperature can also be used for measuring light, for example using forward-biased photosensitive diodes. Instead of the resistor 16 for pulse modification at the output of the Schmitt trigger 14, it is also possible for a timer to be used which is connected between the base of the transistor 13 and the output of the Schmitt trigger 14.

In the exemplary embodiment shown in FIG. 3, the silicon temperature of a power MOS field-effect transistor 21 is to be monitored. For this purpose, a diode 21' is also integrated in the field-effect transistor 21 itself and can thus record the silicon temperature exactly. The cathode connection of the diode 21' is in this case internally coupled to the drain connection of the field-effect transistor 21, so that, in normal operation of the field-effect transistor 21, i.e. with a positive supply potential 22 at its drain connection and a negative supply potential 23, supplied via a load resistor 24, at its source connection, the diode 21' is reverse-biased. The gate of the field-effect transistor 21 is driven by a microcontroller 25 via a driver 26. In addition to the chip temperature of the field-effect transistor 21, the temperature of its surroundings is also measured, specifically using an externally disposed diode 27 whose cathode connection is likewise connected to the positive supply potential 22. The anodes of the diodes 21' and 27 are each connected to the negative reference-ground potential 23 via a respective resistor 28 and 29 and a respective capacitor 30 and 31. The resistors 28 and 29 are in this case used for current limiting in the event of the diodes 21' and 27, respectively, breaking down.

The capacitors 30 and 31 each form an integrator for integrating the current supplied by the diodes 21' and 27, respectively. The integrators are reset by the capacitors 30 and 31 being discharged to a specific starting value. In the present exemplary embodiment, the discharging is performed in each case by a diode 32 or 33 whose anode connection is connected to the node between the resistor 28 and the capacitor 30, or the resistor 29 and the capacitor 31. The cathodes of the two diodes are connected to one another and are driven by a switching stage 34 inside the microcontroller 25. In this case, the switching stage 34 can assume two different levels at its output, namely a high level corresponding to a positive supply potential and a low level that essentially corresponds to the negative supply potential 23. The H level is in this case selected to be greater than the maximum voltage produced across the capacitors 30 and 31. The diodes 32 and 33 therefore do not conduct at the H level and the switching stage 34 thus has no influence on the capacitors 30 and 31. On the other hand, 32 and 33 do conduct at the L level and thus discharge the capacitors 30 and 31 down to the voltages dropped across the diodes 32 and 33. These voltages each form the starting value for the capacitors 30 and 31, which act as integrators.

The voltage across the capacitors 30 and 31 is fed to a respective comparator 35 or 36 which compares it in each case with a reference voltage 37 or 38 representing a threshold value. If one of the two threshold values is exceeded, an interrupt is triggered in the central processor unit 39, which then assumes the count of a counter 40. Appropriate circuits inside the microcontroller/microcomputer (e.g. capture units) allow the values from the counter 40 to be detected even without any direct action by the central processor unit 39. The counter 40 is driven by a clock signal generator 41 and counts steadily, beginning at zero, up to a maximum count, before beginning at zero again. When the maximum count is reached, a signal of specified duration is supplied to the switching stage 34 connected to the counter 40, and the switching stage 34 then changes over from the H level to the L level and thus resets the capacitors 30 and 31. The counter 40 then begins at zero again, which also causes the switching stage 34 to change to the H level again. If a longer discharge duration is required, then another appropriate timer 42 can be connected upstream of the switching stage 34. When the interrupt occurs, the central processor unit 39 evaluates which of the two comparators 35 and 36 has produced the interrupt, and uses the counter 40 to determine the associated measured temperature value. This information is then used to take appropriate measures for driving the field-effect transistor 21. Thus, for example, comparison of the chip temperature and the ambient temperature can be used to determine whether or not there is a risk of the field-effect transistor 21 overheating, and to take precautionary measures on the basis of this.

We claim:

1. A measuring apparatus, comprising:

a sensor element producing a sensor output signal proportional to a variable to be measured;

an integrator formed by a capacitor connected to said sensor element that, beginning at a starting value, integrates the sensor output signal from said sensor element and outputs an integrator output signal, a voltage across said capacitor corresponding to an integral of an output current from said sensor element;

a comparator connected downstream of said integrator, said comparator comparing the integrator output signal with a threshold value and outputs a comparator output signal corresponding to a result of the comparison; and a reset device connected downstream of said comparator and resetting said integrator to the starting value at specific times.

2. The apparatus according to claim 1, including a resistor connected upstream of said capacitor.

3. A measuring apparatus, comprising:

a sensor element producing a sensor output signal proportional to a variable to be measured;

an integrator connected to said sensor element that, beginning at a starting value, integrates the sensor output signal from said sensor element and outputs an integrator output signal;

a comparator connected downstream of said integrator, said comparator comparing the integrator output signal with a threshold value and outputs a comparator output signal corresponding to a result of the comparison;

a reset device connected downstream of said comparator and resetting said integrator to the starting value at specific times; and a time measuring device connected downstream of said comparator and measuring a time duration between the starting value appearing and the threshold value being exceeded, said time measuring device to output a time signal corresponding to the time duration as a measure of the variable obtained at said sensor element.

4. The apparatus according to claim 2, wherein said integrator is reset to the starting value after the threshold value has been exceeded, and then said integrator begins integration again.

5. The apparatus according to claim 3, including a reference clock source, said time measuring device having a counter connected downstream of said reference clock source and controlled by said comparator.

6. A measuring apparatus, comprising:

a sensor element producing a sensor output signal proportional to a variable to be measured;

an integrator connected to said sensor element that, beginning at a starting value, integrates the sensor output signal from said sensor element and outputs an integrator output signal, said integrator being reset at regular time intervals;

a comparator connected downstream of said integrator, said comparator comparing the integrator output signal with a threshold value and outputs a comparator output signal corresponding to a result of the comparison; and a reset device connected downstream of said comparator and resetting said integrator to the starting value at specific times.

7. A measuring apparatus, comprising:

a sensor element producing a sensor output signal proportional to a variable to be measured;

an integrator connected to said sensor element that, beginning at a starting value, integrates the sensor output signal from said sensor element and outputs an integrator output signal;

a comparator connected downstream of said integrator, said comparator comparing the integrator output signal with a threshold value and outputs a comparator output signal corresponding to a result of the comparison; and a reset device connected downstream of said comparator and resetting said integrator to the starting value at specific times, said reset device having a controlled switch connecting a reference voltage, corresponding to the starting value, to said integrator if the threshold value of said comparator is exceeded.

8. A measuring apparatus, comprising:

a sensor element having a reverse-biased pn semiconductor junction for measuring temperature and producing a sensor output signal proportional to a variable to be measured;

an integrator connected to said sensor element that, beginning at a starting value, integrates the sensor output signal from said sensor element and outputs an integrator output signal;

a comparator connected downstream of said integrator, said comparator comparing the integrator output signal with a threshold value and outputs a comparator output signal corresponding to a result of the comparison; and a reset device connected downstream of said comparator and resetting said integrator to the starting value at specific times.

9. The apparatus according to claim 8, including a semiconductor component for detecting the temperature and said reversed-biased pn semiconductor junction integrated into said semiconductor component.

10. A measuring apparatus, comprising:

a sensor element producing a sensor output signal proportional to a variable to be measured;

an integrator connected to said sensor element that, beginning at a starting value, integrates the sensor output signal from said sensor element and outputs an integrator output signal;

a comparator connected downstream of said integrator, said comparator comparing the integrator output signal with a threshold value and outputs a comparator output signal corresponding to a result of the comparison; and a reset device connected downstream of said comparator and resetting said integrator to the starting value at specific times;

a time measuring device connected downstream of said comparator and measuring a time duration between the starting value appearing and the threshold value being exceeded, said time measuring device to output a time signal corresponding to the time duration as a measure of the variable obtained at said sensor element; and a microcomputers, at least one of said comparator, said time measuring device and said reset device being disposed in said microcomputer.

11. A measuring apparatus, comprising:

a sensor element producing a sensor output signal proportional to a variable to be measured;

an integrator connected to said sensor element that, beginning at a starting value, integrates the sensor output signal from said sensor element and outputs an integrator output signal;

a comparator connected downstream of said integrator, said comparator comparing the integrator output signal with a threshold value and outputs a comparator output signal corresponding to a result of the comparison; and a reset device connected downstream of said comparator and resetting said integrator to the starting value at specific times;

a time measuring device connected downstream of said comparator and measuring a time duration between the starting value appearing and the threshold value being exceeded, said time measuring device to output a time signal corresponding to the time duration as a measure of the variable obtained at said sensor element; and a microcontroller, at least one of said comparator, said time measuring device and said reset device being disposed in said microcontroller.

* * * * *